(12) United States Patent
Yuan et al.

(10) Patent No.: US 8,279,411 B2
(45) Date of Patent: Oct. 2, 2012

(54) SYSTEMS AND METHODS FOR REDUCING CROSSTALK IN AN AVALANCHE PHOTODIODE DETECTOR ARRAY

(75) Inventors: Ping Yuan, Encino, CA (US); Paul A. McDonald, Simi Valley, CA (US)

(73) Assignee: The Boeing Company, Chicago, IL (US)

( * ) Notice: Subject to any disclaimer, the term of this patent is extended or adjusted under 35 U.S.C. 154(b) by 691 days.

(21) Appl. No.: 12/199,598

(22) Filed: Aug. 27, 2008

(65) Prior Publication Data
US 2010/0053594 A1    Mar. 4, 2010

(51) Int. Cl.
*G01C 3/08*    (2006.01)
(52) U.S. Cl. ......... 356/4.01; 356/4.1; 356/5.01; 356/5.1
(58) Field of Classification Search ............... 356/4.01, 356/5.01; 257/431, 435, 438, E31.037, E31.128
See application file for complete search history.

(56) References Cited

U.S. PATENT DOCUMENTS

| 4,203,124 | A |   | 5/1980  | Gordon et al. |   |
|---|---|---|---|---|---|
| 4,250,516 | A |   | 2/1981  | Worlock |   |
| 4,403,397 | A | * | 9/1983  | Bottka et al. | 438/66 |
| 6,359,322 | B1 |   | 3/2002  | Haralson et al. |   |
| 6,384,462 | B1 |   | 5/2002  | Pauchard et al. |   |
| 6,459,107 | B2 |   | 10/2002 | Sugiyama et al. |   |
| 6,963,089 | B2 |   | 11/2005 | Shi et al. |   |
| 7,082,248 | B1 |   | 7/2006  | Morse |   |
| 7,209,623 | B2 |   | 4/2007  | Morse |   |
| 7,233,051 | B2 |   | 6/2007  | Morse et al. |   |
| 7,248,344 | B2 | * | 7/2007  | Morcom | 356/10 |
| 2002/0185702 | A1 | * | 12/2002 | Shirai et al. | 257/443 |
| 2005/0029541 | A1 |   | 2/2005  | Ko |   |
| 2006/0006309 | A1 |   | 1/2006  | Dimsdale et al. |   |
| 2007/0164385 | A1 |   | 7/2007  | Morse et al. |   |
| 2008/0100822 | A1 | * | 5/2008  | Munro | 356/4.01 |
| 2008/0143997 | A1 | * | 6/2008  | Greenberg et al. | 356/4.01 |
| 2009/0008738 | A1 | * | 1/2009  | Yuan et al. | 257/438 |
| 2009/0256223 | A1 | * | 10/2009 | Yamamura et al. | 257/432 |
| 2011/0169121 | A1 | * | 7/2011  | Bui et al. | 257/437 |

FOREIGN PATENT DOCUMENTS
WO    WO 2008004547 A1 *   1/2008

* cited by examiner

*Primary Examiner* — Luke Ratcliffe
(74) *Attorney, Agent, or Firm* — Armstrong Teasdale, LLP

(57) ABSTRACT

A method of fabricating a photodiode detector array is provided. The method facilitates a reduction in secondary photon emission detection by the photodiode detector array. The method includes fabricating an array of active regions, wherein the array of active regions comprises a plurality of active regions. The method also includes positioning a passivation region in optical paths between the active regions. The passivation region includes at least one of a photon-absorbing material and a trench.

17 Claims, 5 Drawing Sheets

US 8,279,411 B2

SYSTEMS AND METHODS FOR REDUCING CROSSTALK IN AN AVALANCHE PHOTODIODE DETECTOR ARRAY

BACKGROUND

The field of the disclosure relates generally to 3D-imaging used to obtain ranging information of objects in the field, and more specifically to methods and systems that facilitate a reduction in photon crosstalk between individual pixels of an avalanche photodiode detector array.

Objects may be inspected, for example, to determine a size and/or shape of all, or a portion, of the object and/or to detect defects in the object. For example, known gas turbine engine components, such as turbine or compressor blades, are routinely inspected to detect fatigue cracks that may be caused by vibratory, mechanical, and/or thermal stresses induced to the engine. Moreover, and for example, some gas turbine engine blades are inspected for deformations such as platform orientation, contour cross-section, bow and twist along a stacking axis, thickness, and/or chord length at given cross-sections. Over time, continued operation of a component with one or more defects may reduce performance of the component, and/or lead to component failures, for example, as cracks propagate through the component. Accordingly, detecting defects within components, as early as possible, may facilitate increasing the performance of the system in which the component is incorporated and/or reducing component failures.

To facilitate 3-D imaging, a laser beam of a laser detection and ranging (LADAR) system is projected onto the surface of the target. An array of photodiode detectors receive light reflected from the surface of the target and a series of amplifiers and a processor record the positions of light detectors within the array that detected the reflected light and the corresponding travel time of the pulse of light to each of the detectors. From this information, the processor develops a 3D image of the target.

LADAR operating in the short wavelength infrared (SWIR) region (1.0-1.6 µm) is a promising tool for 3D-imaging and enabling precision target identification under low-light-level conditions. An avalanche photodiode (APD) focal plane array (FPA) is an example of a LADAR detector capable of single-photon level detection and imaging. However, because the APD pixels are biased very close to or even beyond a nominal breakdown voltage, they are sensitive to incident photons. A single charge carrier (i.e., a single photon) injected into a depletion layer of the APD pixel triggers an avalanche breakdown, which produces electrons and a resulting avalanche current. The leading edge of the avalanche pulse corresponds to the arrival time of the detected photon. When the APD FPA is used for imaging, the arrival time of the detected photon is used to create an image. However, with many carriers in the depleted region, any recombination in this process may generate secondary photon emission, which may be captured by other biased pixels in the array. It would be desirable to optically isolate each pixel of the array to facilitate prevention of ruined imaging due to secondary photon emissions.

SUMMARY

In one aspect, a method of fabricating a photodiode detector array is provided. The method facilitates a reduction in secondary photon emission detection by the photodiode detector array. The method includes fabricating an array of active regions, wherein the array of active regions comprises a plurality of active regions. The method also includes positioning a passivation region in optical paths between the active regions. The passivation region includes at least one of a photon-absorbing material and a trench.

In another aspect, a photodiode detector array configured to facilitate a reduction in secondary photon emission detection is provided. The photodiode detector array includes a first active region and a second active region for detecting photons. The photodiode detector array also includes a passivation region disposed between the first active region and the second active region. The passivation region includes a photon-absorbing trench configured to prevent a secondary photon emission from passing between the first active region and the second active region.

In yet another aspect, a laser detection and ranging (LADAR) system for three-dimensional imaging is provided. The system includes a laser source configured to project a laser beam onto an object being examined and a photodiode array configured to produce a signal upon detection of light reflected from the object being examined. The photodiode array includes a first active region and a second active region for detecting photons and a passivation region disposed between the active regions. The passivation region includes a photon-absorbing trench configured to prevent a secondary photon emission from passing between the active regions. The system also includes a control and amplifier circuit configured to provide the photodiode array with biasing voltages and amplify an output signal, and a processor configured to receive the output signal from the control and amplifier circuit and to calculate a time between discharge of the laser beam and receipt at the photodiode array.

The features, functions, and advantages that have been discussed can be achieved independently in various embodiments of the present invention or may be combined in yet other embodiments further details of which can be seen with reference to the following description and drawings.

DETAILED DESCRIPTION

Figure 1:
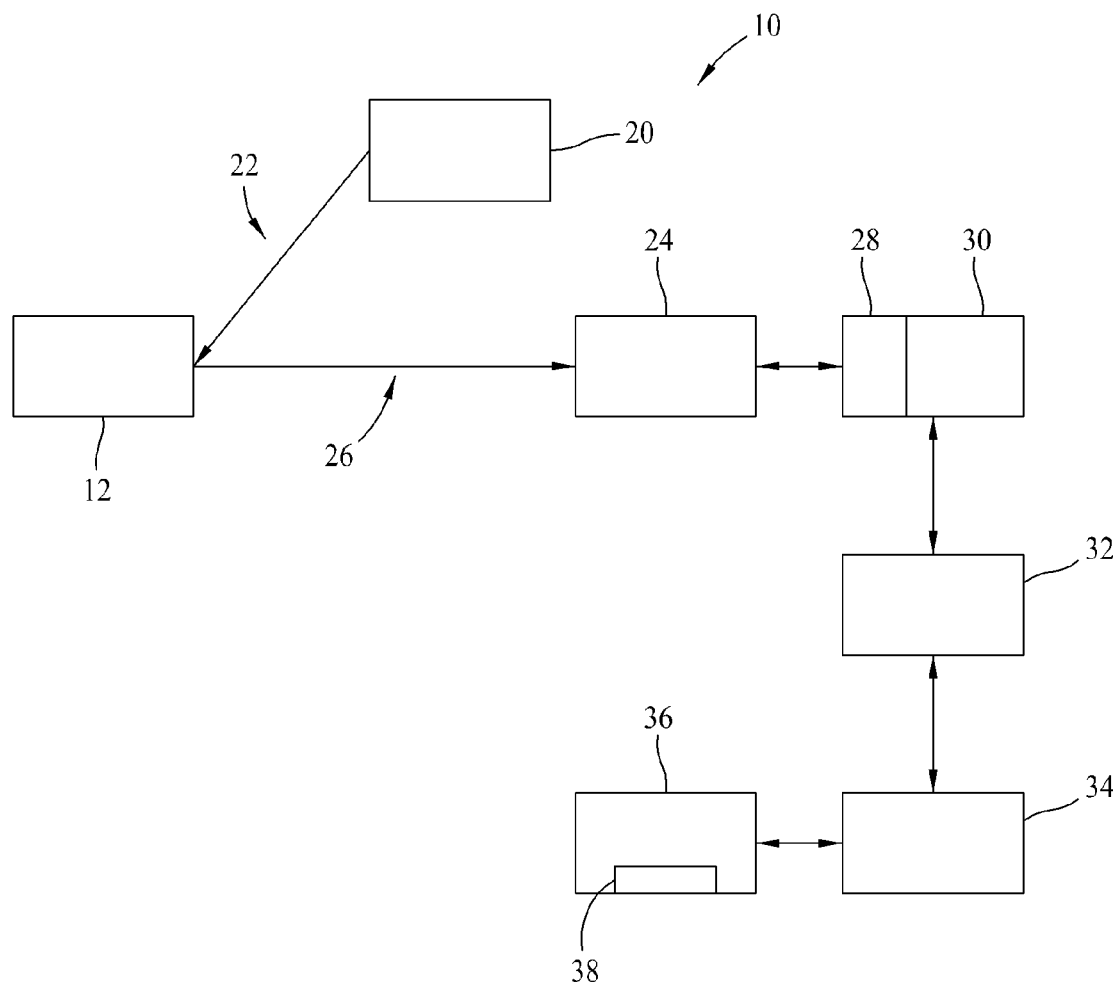
FIG. 1 is a block diagram of an exemplary laser detection and ranging system.

FIG. 1 is a block diagram of an exemplary laser detection and ranging system 10 that may be used to measure a plurality of 3-D surface features of an object 12. For example, system 10 may be used to inspect surfaces of object 12, wherein such object surfaces may include features such as tilts, cracks, bends, twists, and/or warps.

In the exemplary embodiment, system 10 includes a laser 20 that emits an optical pulse 22. Laser 20 is positioned such that optical pulse 22 illuminates at least a portion of object 12. System 10 also includes a photodiode detector array 24. A plurality of individual photodiode detectors (not shown in FIG. 1) are arranged to form photodiode detector array 24. Photodiode detector array 24 is configured to detect light reflected from object 12, for example, reflected pulse 26. In the exemplary embodiment, photodiode detector array 24 is an avalanche photodiode (APD) focal plane array (FPA). However, other photodiode detector arrays may be used that enable system 10 to function as described herein.

The reflected pulse 26 detected by photodiode detector array 24 is made up of a plurality of photons. In the exemplary embodiment, the sensitivity of an APD focal-plan array (FPA) facilitates sensing of as little as a single photon. In the exemplary embodiment, photodiode detector array 24 is impinged by photon 26 and produces a signal corresponding to detection of that photon. A series of amplifiers 28 and a control circuit 30 are coupled to photodiode detector array 24. Amplifiers 28 and control circuit 30 provide photodiode 24 with, for example, biasing voltages and amplify the signal that corresponds to detection of the reflected photon pulse 26. The amplified signal is feed to a readout integrated circuit (IC) and headboard 32, which calculate the transmit time between the laser emission from laser 20 and detection of the photon at photodiode array 24. Ranging information for each image pixel is then calculated based on the transmit time.

In the exemplary embodiment, a computer 34 may be utilized to display information to an operator. In one embodiment, computer(s) 34 include a device 36, for example, a floppy disk drive, CD-ROM drive, DVD drive, magnetic optical disk (MOD) device, and/or any other digital device including a network connecting device, such as an Ethernet device, for reading instructions and/or data from a computer-readable medium 38, such as a floppy disk, a CD-ROM, a DVD, and/or another digital source such as a network or the Internet, as well as yet to be developed digital means.

In an alternative embodiment, computer(s) 34 execute instructions stored in firmware (not shown). Computer(s) 34 are programmed to perform functions described herein, and as used herein, the term "computer" is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein.

Figure 2:
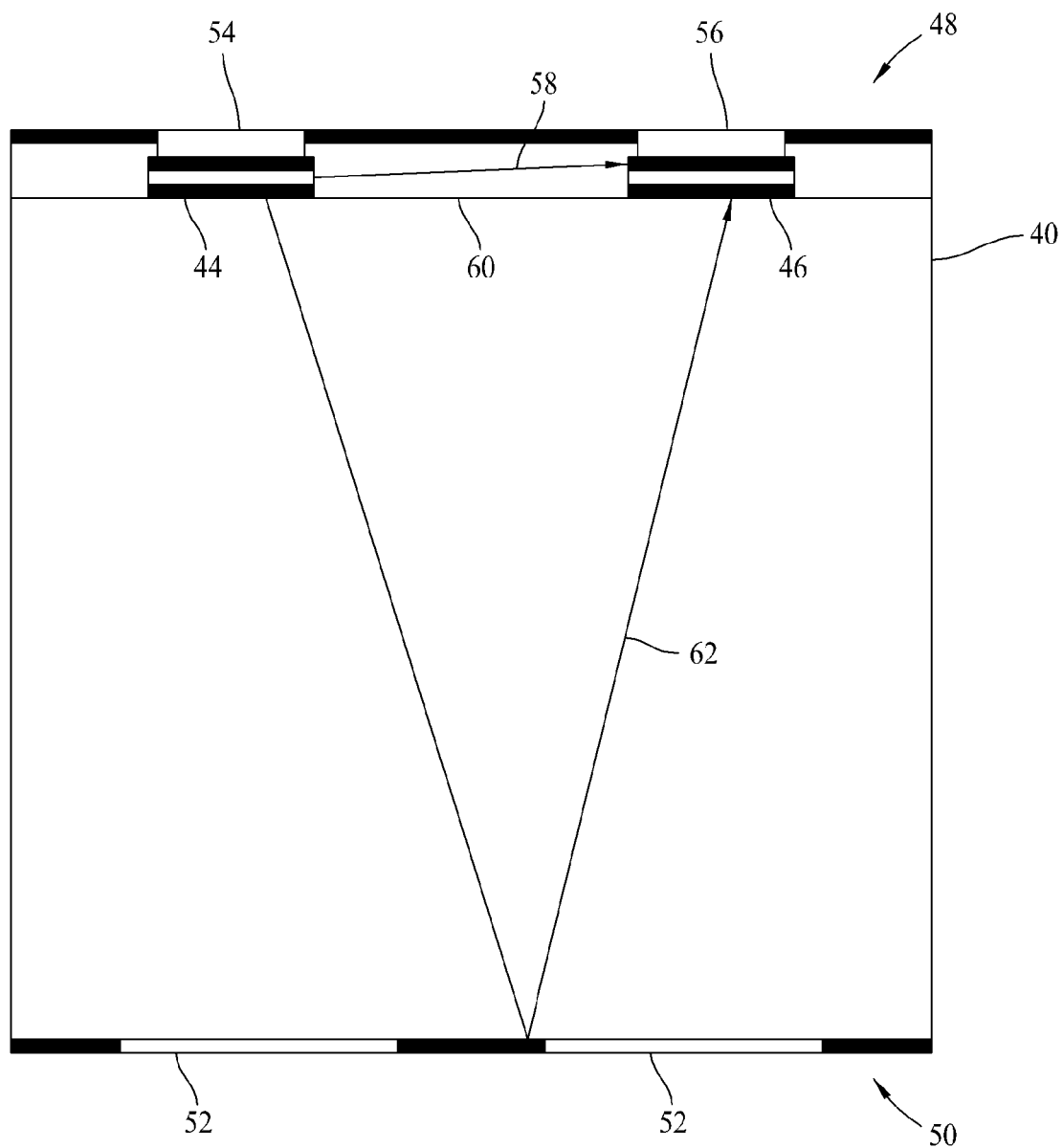
FIG. 2 is a cross-sectional view of an exemplary photodiode detector array with two pixels for use with the LADAR system shown in FIG. 1.

FIG. 2 is a cross-sectional view of an exemplary photodiode detector array 40 for use with LADAR system 10 shown in FIG. 1. In the exemplary embodiment, photodiode detector array 40 is an APD array with two pixels 44 and 46 (also referred to herein as "active regions") in the displayed portion. In the exemplary embodiment, pixels 44 and 46 are processed from an epitaxial structure grown on a semiconductor substrate. Array 40 includes a front surface 48 and a back surface 50. For convenience of packaging, array 40 is back illuminated and includes at least one optical window 52 on the back 50 of the substrate.

As stated above, because the APD pixels are biased very close to, or even beyond, a nominal breakdown voltage, they are sensitive to incident photons. A single charge carrier (i.e., a single photon) injected into a depletion layer of active regions 44 or 46 triggers an avalanche breakdown, which produces electrons and a resulting avalanche current. The leading edge of the avalanche pulse corresponds to the arrival time of the detected photon, or the target distance. When the APD FPA is used for imaging, the arrival time of the detected photon is used to create an image that includes ranging information. With many carriers in a depleted region, any recombination of the carriers in this process may generate a secondary photon emission. The secondary photon emission may propagate through the APD array and may be captured by other biased pixels in the array. In other words, a photon detected at active region 44 may cause an unintended photon detection (i.e. of the secondary photon emission) in active region 46. The detection of secondary photon emissions is referred to herein as "crosstalk." The presence of crosstalk within an APD array may prevent system 10 (shown in FIG. 1) from obtaining a clear image. In practice, there are three paths for secondary photon emissions from one active region, for example active region 44, to reach a second active region, for example active region 46. In other words, there are three paths through which a secondary photon emission can transmit and cause the neighbor pixels to register a false detection.

The secondary photon emission may escape active region 44 and propagate upward through the array front surface 48. These photons can be scattered afterward to neighboring pixels, for example, active region 46. Metal contacts 54 and 56 cover pixels 44 and 46, effectively blocking the front 48 emission of secondary photons.

A second path 58 that a secondary photon emission may take between active region 44 and active region 46 is nearly parallel to the array surface. A secondary photon emission may escape active region 44 and move laterally through a passivation region 60. For example, region 60 may be a substrate such as Indium Phosphide (InP), or any passivation material that allows array 40 to function as described herein. Typical materials in region 60 do not effectively absorb secondary photon emissions produced at active regions 44 and 46.

A third path 62 that a secondary photon emission may take between active region 44 and active region 46 is via a reflection at back interface 50. A secondary photon emission may escape active region 44, travel toward back interface 50, and be reflected toward active region 46.

Figure 3:
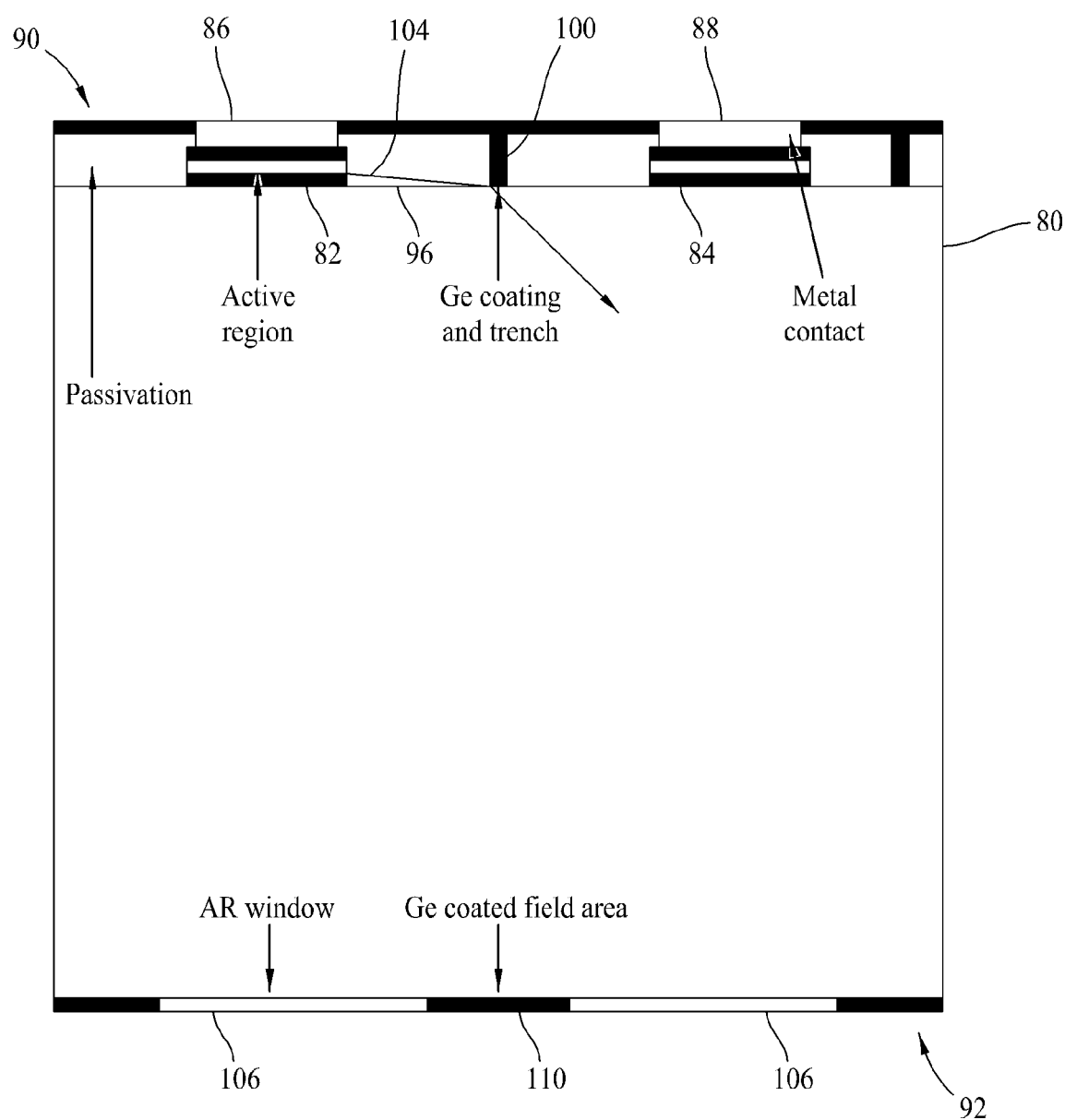
FIG. 3 is a cross-sectional view of an exemplary photodiode detector array that includes crosstalk reduction features for use with the LADAR system shown in FIG. 1.

FIG. 3 is a cross-sectional view of an exemplary photodiode detector array 80 that includes crosstalk reduction features for use with LADAR system 10 shown in FIG. 1. In the exemplary embodiment, photodiode detector array 80 includes active regions 82 and 84. In the exemplary embodiment, array 80 also includes metal contacts 86 and 88. Metal contacts 86 and 88 are positioned at a front 90 of array 80, and positioned to facilitate reduction/elimination of front emissions of secondary photon emissions. More specifically, if a secondary photon emission is emitted by first active region 82 and directed toward front interface 90, contact 86 reflects the emission toward a back 92 of array 80.

In the exemplary embodiment, array 80 also includes a region 96 surrounding the active regions. As described above with respect to region 60, region 96 is formed from, for example, InP or passivation materials.

In known APD arrays, semiconductors for the SWIR region APDs are typically Indium Gallium Arsenide (InGaAs), Indium Gallium Arsenide Phosphide (InGaAsP), InP, and Indium Aluminum Arsenide (InAlAs). The bandgaps of InGaAs, InGaAsP, InP, and InAlAs range from approximately 0.75 eV to 1.42 eV at room temperature. Although, pixels in an APD array are typically separated by 40-100 μm, the substrate InP with a bandgap of approximately 1.35 eV cannot effectively absorb most of the spectrum of secondary photon emissions produced by the above listed semiconductors. In the exemplary embodiment, region 96 surrounding the pixels can be divided by a trench 100. Trench 100 is coated with a photon absorbing material, for example, but not limited to, Germanium (Ge). With a bandgap of approximately 0.66 eV and compatibility to the metalization process, Ge absorbs secondary photon emissions from the triggered APD pixels. Coating both sides of trench 100 with Ge, and/or including Ge within trench 100, reduces the optical crosstalk between pixels 82 and 84, and improves the stability and contrast of images produced by FPAs.

Due to a high index contrast between InP substrate and the passivation materials in region 96, tangent rays from active region 82, for example, a tangent ray 104, can escape the absorption in trench 100, but they are bent away from active region 84. Ray 104 will be eventually either escape from the substrate through a window 106 or be absorbed in a back absorber field 110 described further below. With minor modifications, this structure can also be applied to planar device structures, in which region 96 consists of the device material. Because of little refractive bending in a planar device, trench 100 needs to be deeper than that used in a non-planar structure.

In another exemplary embodiment, for instances where trench 100 is difficult to implement, an absorbing substance is combined with the passivating material such that layer 96 is opaque to the SWIR region. Since the pixel pitch is large (i.e., tens of microns in lateral directions), the attenuation of secondary photon emissions will be very strong, and the crosstalk will be greatly reduced. The absorbing substance may be, for example, but not limited to, an organic dye and/or a nano-particulate iron oxide. Iron oxide particles are established as filler materials in polymer coating materials and the optical absorption in the near IR spectral region is reasonably strong. Passivating material blended with iron oxide nano-particulate results in an opaque layer surrounding the active APD devices. This approach can also be applied to planar designs and be used as a planarizing material.

As described above, the third path 62 (shown in FIG. 2) for secondary photon emissions to reach unintended pixels is via a reflection from the back interface 92. For large arrays, optical windows 106 typically are positioned at back interface 92. Windows 106 may be coated with a broadband anti-reflective coating, to facilitate a reduction in the reflection from windows 106. To further reduce reflection of secondary photon emissions off of back interface 92 and to block stray light in the optical system, windows 106 are sized such that photodiode detector array 80 functions as described herein, (i.e., sized to allow photons to enter photodiode detector array 80). Furthermore, a field 110 between windows 106 is coated with a photon absorbing material, for example, but not limited to, Ge. Minimizing the size of windows 106 and coating field 110 with a photon absorbing material, facilitate a reduction in false photon detections, caused by secondary photon emissions reflected from the back interface 92. This optical path is illustrated as path 62 in FIG. 2. Furthermore, a secondary photon emission that travels to one of windows 106 will pass through the window 106 and not be reflected due to the anti-reflective coating.

Figure 4:
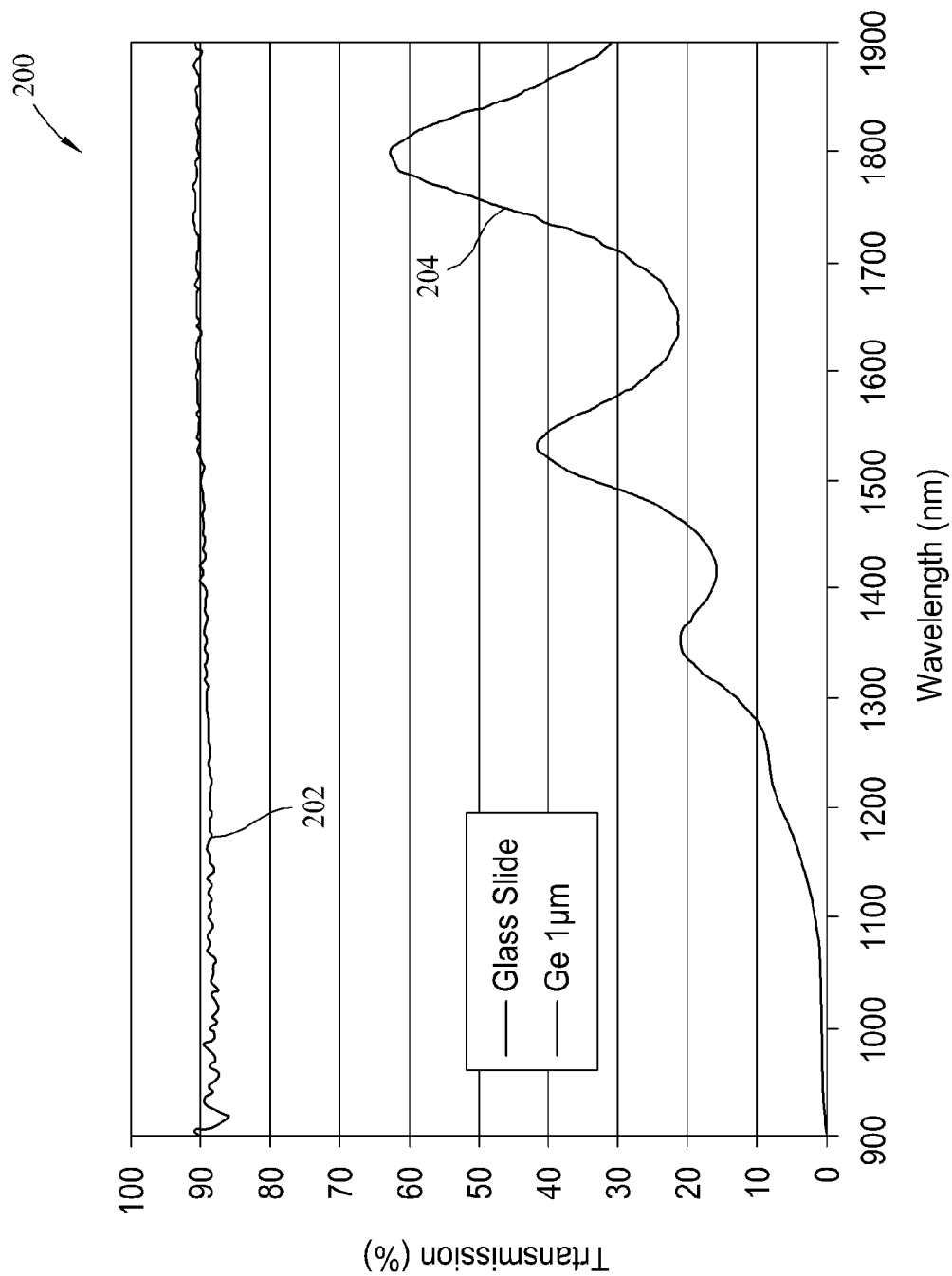
FIG. 4 is a plot of an exemplary absorption spectrum of a glass slide and an exemplary absorption spectrum of a coated glass slide.

FIG. 4 is a plot 200 that shows an exemplary transmission spectrum 202 of a glass slide and an exemplary transmission spectrum 204 of a Ge-coated glass slide. The Ge layer, whose transmission spectrum is shown in plot 204, may be used in field 110 (shown in FIG. 3). In the exemplary embodiment, the coating is a 1 μm thick e-beam evaporated polycrystalline Ge, deposited on a 1 mm glass slide. By subtracting the interference ripples, the transparency of a single pass of such a layer is approximately 30% at 1650 nm, which is approximately the emission wavelength of InGaAs. In the exemplary embodiment, a lack of index mismatch between the InP substrate and Ge layer facilitates the back reflection taking a double pass through this absorptive layer. In an alternative embodiment, a 2-3 μm thick Ge layer may facilitate suppression of the reflection to 1%.

Figure 5:
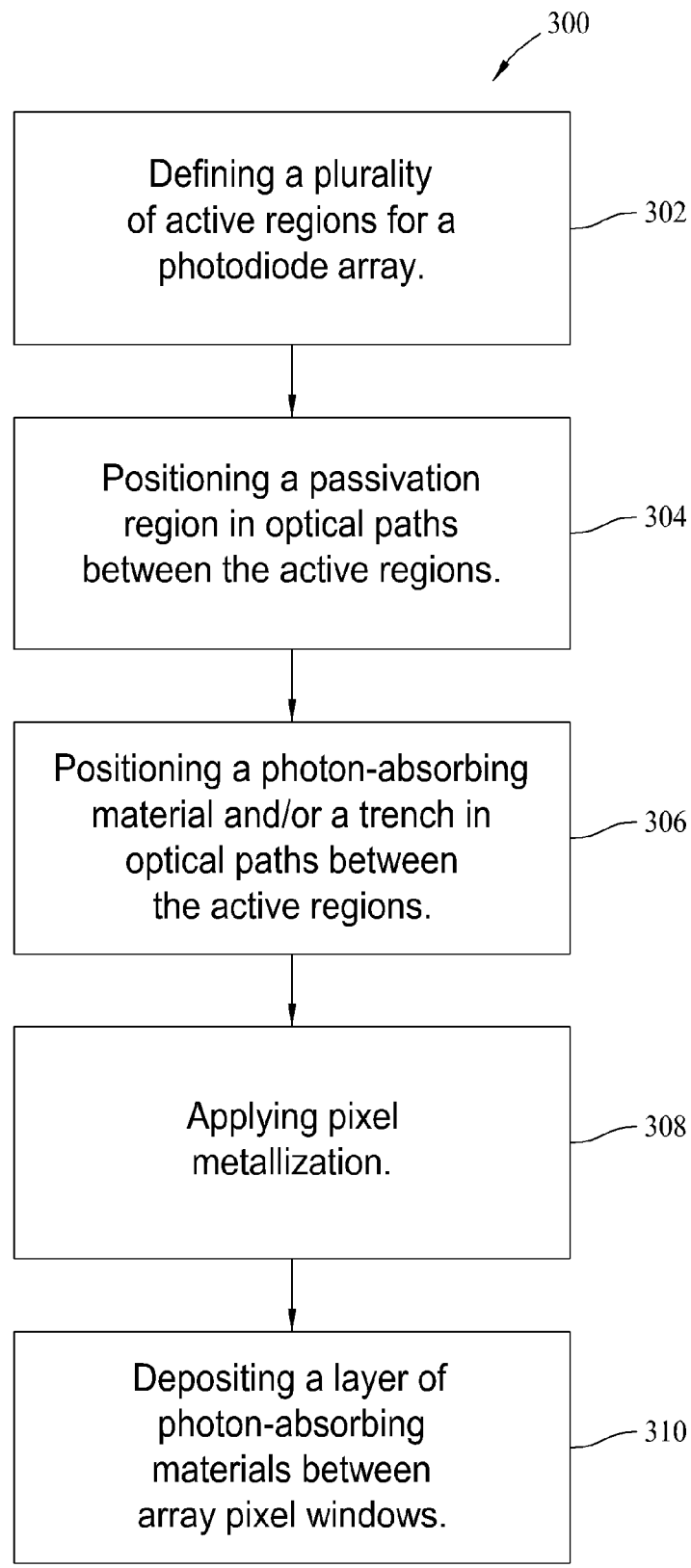
FIG. 5 is a flowchart illustrating exemplary processes utilized to facilitate a reduction in secondary photon detection within the system shown in FIG. 1.

FIG. 5 is a flowchart 300 illustrating an exemplary process of fabricating a photodiode detector array that facilitates a reduction in secondary photon detection within system 10 (shown in FIG. 1). The method includes defining 302 a plurality of active regions for a photodiode array. The method also includes positioning 304 a passivation region between the active regions. In the exemplary embodiment, positioning 304 the passivation region includes positioning 306 photon-absorbing material and/or a trench that is configured to include, either on the surface of, or within the trench, a photon-absorbing material, in optical paths between the active regions. Applying photon-absorbing materials in optical paths between the active regions facilitates prevention of lateral crosstalk.

The method may also include applying 308 pixel metallization and depositing 310 a layer of photon absorbing materials between array pixel windows. Applying pixel metallization 308 and depositing 310 a layer of photon-absorbing materials facilitate prevention of reflective crosstalk between the active regions 82 and 84, for example, reflected from front 90 or back 92 of the APD array 80 (shown in FIG. 3).

The above-described photo detector array is cost-effective and highly sensitive. The above-described photo detector array facilitates a reduction in secondary emission detection by incorporating absorbers in the optical paths between pixels. The above-described photo detector array and crosstalk reduction features facilitate a reduction in optical crosstalk between the photo detector array pixels, which facilitates an improvement in the stability and contrast of the LADAR system incorporating the photo detector array and crosstalk reduction features. As a result, the photo detector array and crosstalk reduction features prevent detection of secondary photon emissions in a cost-effective and reliable manner.

Exemplary embodiments of systems and methods for facilitating a reduction in optical crosstalk between photo detector array pixels are described above in detail. The systems and methods are not limited to the specific embodiments described herein, but rather, components of systems and/or steps of the method may be utilized independently and separately from other components and/or steps described herein.

Although specific features of various embodiments may be shown in some drawings and not in others, this is for convenience only. Any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. A method of fabricating a photodiode detector array, said method facilitates a reduction in secondary photon emission detection by the photodiode detector array, said method comprising:
fabricating an array of active regions, wherein the array of active regions comprises a plurality of active regions proximate a front surface of a substrate, the substrate including a back interface, an optical path being defined as extending from one active region to the back interface, and from the back interface towards another of the active regions;

positioning a metal contact on each of the plurality of active regions, each metal contact being positioned between the front surface of the substrate and a corresponding one of the plurality of active regions such that secondary photon emissions are reflected back toward an active region that emitted the secondary photon; and positioning at least one photon absorbing material in the optical paths between the active regions, proximate the back interface.

2. A method in accordance with claim 1 further comprising positioning a trench between the active regions, said trench comprising photon absorbing materials therein.

3. A method in accordance with claim 1 further positioning materials within the trench said materials having an index of refraction such that secondary photon emissions are deflected away from active regions.

4. A method in accordance with claim 3, wherein positioning materials within the trench comprises lining the trench with a Germanium lining.

5. A method in accordance with claim 1 further comprising configuring at least one window proximate the back interface to direct photons to one of the plurality of active regions.

6. A method in accordance with claim 5 further comprising positioning a layer of photon absorbing material between a first window and a second window.

7. A method in accordance with claim 6, wherein positioning a layer of photon absorbing material comprises positioning a layer comprising Germanium between the first window and the second window.

8. A photodiode detector array configured to facilitate a reduction in secondary photon emission detection, said photodiode detector array comprising:
 a substrate comprising a front surface and a back surface;
 a first active region and a second active region for detecting photons proximate said front surface, an optical path being defined from said first active region to said back surface to said second active region;
 a first metal contact positioned between said front surface and said first active region;
 a second metal contact positioned between said front surface and said second active region; and
 a layer of photon absorbing material disposed proximate said back surface of said substrate.

9. A photodiode detector array in accordance with claim 8, further comprising a passivation region disposed between said first active region and said second active region, wherein said passivation region includes material having an index of refraction such that photons from said first active region are deflected away from said second active region.

10. A photodiode detector array in accordance with claim 9 further comprising a layer of photon absorbing material positioned within said passivation region, said layer of photon absorbing material configured to absorb lateral secondary photon emissions.

11. A photodiode detector array in accordance with claim 8 further comprising at least one window proximate said back surface configured to direct photons to one of said first active region and said second active region.

12. A photodiode detector array in accordance with claim 11, wherein said at least one window comprises a first window and a second window, said layer of photon absorbing material disposed between said first window and said second window.

13. A laser detection and ranging (LADAR) system for three-dimensional imaging, said system comprising:
 a laser source configured to project a laser beam onto an object being examined;
 a photodiode array configured to produce a signal upon detection of light reflected from the object being examined, said photodiode array comprising:
  a substrate comprising a front surface and a back surface;
  a first active region and a second active region for detecting photons proximate said front surface, a reflective optical path being defined from said first active region to said back surface to said second active region;
  a first metal contact positioned between said front surface and said first active region;
  a second metal contact positioned between said front surface and said second active region; and
  a layer of photon absorbing material disposed proximate said back surface of said substrate;
 a control and amplifier circuit configured to provide said photodiode array with biasing voltages and amplify an output signal; and
 a processor configured to receive said output signal from said control and amplifier circuit and to calculate a time between discharge of the laser beam and receipt at said photodiode array.

14. A LADAR system in accordance with claim 13, further comprising a passivation region disposed between said active regions, said passivation region including a photon-absorbing trench configured to prevent a secondary photon emission from passing between said active regions, wherein said passivation region further comprises material having an index of refraction such that photons emitted from said first active region are deflected away from said second active region.

15. A LADAR system in accordance with claim 14, wherein said material further comprises a layer of photon absorbing material positioned within said passivation region, said layer of photon absorbing material configured to absorb lateral secondary photon emissions.

16. A LADAR in accordance with claim 13, wherein said back surface further comprises at least one window configured to direct photons to at least one of said active regions.

17. A LADAR system in accordance with claim 16, wherein said at least one window comprises a first window and a second window, said layer of photon absorbing material disposed between said first window and said second window.

* * * * *